United States Patent
Ventzek et al.

(10) Patent No.: US 7,279,433 B2
(45) Date of Patent: Oct. 9, 2007

(54) DEPOSITION AND PATTERNING OF BORON NITRIDE NANOTUBE ILD

(75) Inventors: Peter L. G. Ventzek, Austin, TX (US); Kurt Junker, Austin, TX (US); Marius Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 237 days.

(21) Appl. No.: 10/945,319

(22) Filed: Sep. 20, 2004

(65) Prior Publication Data

US 2006/0063392 A1     Mar. 23, 2006

(51) Int. Cl.
*H01L 21/31* (2006.01)
(52) U.S. Cl. .......... 438/778; 438/82; 438/623; 438/629; 438/639; 438/725; 257/E21.292
(58) Field of Classification Search ............ None
See application file for complete search history.

(56) References Cited

U.S. PATENT DOCUMENTS

| 5,879,127 | A | 3/1999 | Grunes et al. |
| 6,329,062 | B1* | 12/2001 | Gaynor ............... 428/447 |
| 6,420,092 | B1 | 7/2002 | Yang et al. ........... 430/311 |
| 6,827,982 | B1* | 12/2004 | Huang et al. ......... 427/387 |
| 2003/0180526 | A1 | 9/2003 | Winey et al. |
| 2003/0234465 | A1 | 12/2003 | Chen et al. |
| 2004/0055892 | A1 | 3/2004 | Oh et al. ............. 205/109 |
| 2004/0108298 | A1* | 6/2004 | Gao ..................... 216/13 |
| 2004/0241896 | A1* | 12/2004 | Zhou et al. ............ 438/48 |

OTHER PUBLICATIONS

Ventzek, Peter et al., "Deposition and Patterning of Boron Nitride Nanotube ILD"; Disclosure May 3, 2004 (Internal Freescale Semiconductor document); 10 pages.

* cited by examiner

*Primary Examiner*—Michael Lebentritt
*Assistant Examiner*—Kyoung Lee
(74) *Attorney, Agent, or Firm*—John A. Fortkort; Fortkort & Houston P.C.

(57) ABSTRACT

A method for forming a dielectric layer is disclosed herein. In accordance with the method, a first material is provided (303) which comprises a suspension of nanoparticles in a liquid medium. A dielectric layer is then formed (305) on the substrate from the suspension through an evaporative process.

47 Claims, 12 Drawing Sheets

US 7,279,433 B2

DEPOSITION AND PATTERNING OF BORON NITRIDE NANOTUBE ILD

FIELD OF THE INVENTION

The present invention relates generally to semiconductor processing, and more particularly to the application of nanoparticle technology in the formation of dielectric layers during semiconductor processing.

BACKGROUND OF THE INVENTION

In the past, aluminum and its alloys have been the materials of choice for dual damascene interconnect metallurgies and other Back-End-Of-Line (BEOL) metallization structures utilized in semiconductor devices. These interconnects have typically been embedded in dielectric materials (e.g., $SiO_2$) known as interlayer dielectrics (ILD). The delay in the BEOL structure, and hence its performance characteristics, are dictated by the product of the resistance of the interconnect and the capacitance provided by the ILD materials.

The physical limitations of aluminum interconnects, and in particular their relatively high resistivities, have prevented them from accommodating the need for increased circuit densities and speeds in semiconductor devices. Consequently, copper-based metallurgies have evolved as replacements for aluminum metallurgies in dual damascene interconnect metallurgies and other BEOL metallization structures. Copper-based interconnect metallurgies offer lower resistivities and comparatively lower susceptibility to electromigration failure compared to their aluminum counterparts. The use of copper-based metallurgies also allows capacitance to be exploited in the optimization of interconnect performance. To this end, ultra-low dielectric constant materials have begun supplanting $SiO_2$ as the dielectric materials of choice in which metal lines are embedded.

The material properties of the ILD in dual damascene applications are essential for integration of low RC (Resistance/Capacitance) backend solutions. In particular, this dielectric material must be mechanically strong and possess a very low dielectric constant or k-value. In practice, this dielectric constant must be much lower than that of $SiO_2$, which has a dielectric constant of about 4.1.

One of the challenges facing the commercial implementation of dual damascene processes is the lack of an optimal dielectric material for use in the ILD. In particular, most existing dielectric materials, such as silicon dioxide, porous hydrogen and carbon containing glasses (e.g., SiCOH), or dielectrics based on aromatic hydrocarbon thermosetting polymers, are either unsuitable for use in the ILD layer, are fraught with mechanical stability issues or exhibit k-value integrity issues during processing, or simply have too high of a k-value. Air gap ILDs possess potentially the best k-value, but come with significant patterning, processing and mechanical integrity challenges.

Other known low-k materials are unsuitable for use in dual damascene processes because they require that a protective layer be formed on the etched dielectric layer in order to protect the dielectric material during processing. For example, porous low-k materials require pore sealing for all of the processes used to etch them (i.e., for via formation and cleaning), as well as for the metallization processes used to form the metal interconnects. Potentially, each processing step (e.g., etching, post-etch treatment to remove etch residues, the preparation of exposed metal surfaces, and metal deposition) can degrade the BEOL dielectric constant. Silicon and oxygen-based low-k films whose low k-value is enabled by the presence of carbon are particularly prone to k-value degradation in this regard, since the only known processes that can adequately etch them for high performance and high density computing applications will themselves interact with the carbon and hydrogen in the films.

The use of boron-nitride (BN), and in particular, boron nitride nanotubes (BNNTs), as ILD materials has also been investigated. These materials have attractive hardness and can theoretically provide dielectric layers with very low K-values. However, BNNT compositions have a number of fundamental flaws that have prevented their successful use in BEOL applications. In particular, the k- values achieved with dielectric layers formed from these materials are found to be significantly higher than the values that are theoretically possible, and the mechanical properties of the resulting layers have been found to be inadequate. Moreover, BNNT layers are typically grown from catalyst layers. The extra steps involved in patterning (masking and etching) the catalyst at all the levels of metal and dielectric make this process prohibitively expensive.

There is thus a need in the art for a low-k dielectric material that is suitable for use in dual damascene processes and that exhibits good mechanical properties. There is also a need in the art for a dielectric material whose use in a damascene process does not require additional processing steps, such as those required to manage the impact of film porosity or to pattern catalyst layers. There is further a need in the art for dielectric materials whose k-values are resistant to change from processes that are commonly used in BEOL processes. These and other needs are met by the processes and materials disclosed herein and hereinafter described.

DETAILED DESCRIPTION

As used herein, the term "nanoparticle" is meant to encompass nanotubes, nanoballs, nanohorns, and other shapes assumed by materials on the nanoscale.

It has now been found that suspensions of nanoparticles, such as, for example, suspensions of boron-nitride nanotubes (BNNTs) in a liquid medium, can be used to make dielectric layers having low k-values, high structural integrity and excellent mechanical properties. These materials are also conducive to BEOL integration (that is, they are not adversely affected by BEOL etch, metallization and multi-layer deposition processes). The use of purified suspensions of BNNTs to make dielectric layers through spin coating or through other evaporative processes is especially preferred, due to the particularly favorable combination of excellent hardness, exceptionally high Young's moduli, and reproducible dielectric constants of 2 or less that these materials and the associated methodology afford.

Figure 1:
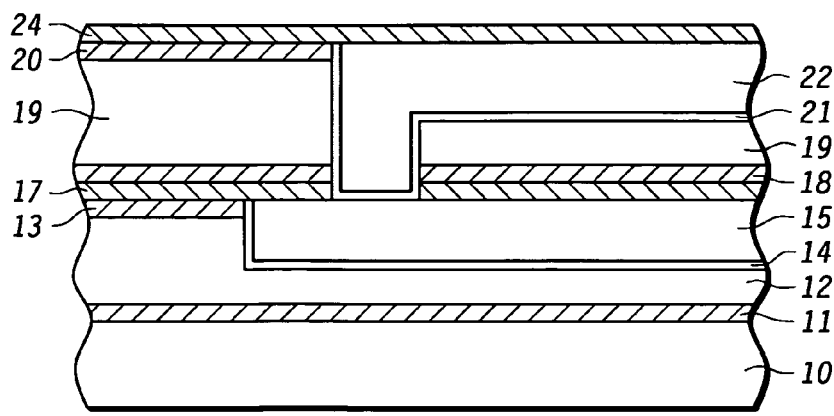
FIG. 1 is a cross-sectional view illustrating a dual damascene interconnect that can be made in accordance with the teachings herein.

FIG. 1 illustrates an interconnect structure that may be made using copper interconnects and a low-k nanoparticle dielectric material of the type disclosed herein. The interconnect structure comprises a lower substrate 10 which may contain logic circuit elements such as transistors. A nanoparticle interlayer dielectric (ILD) 12 overlies the substrate 10. An adhesion promoter layer 11 may be disposed between the substrate 10 and nanoparticle ILD 12, and a layer of silicon nitride 13 or other suitable material may be disposed on the nanoparticle ILD 12 to serve as a hardmask layer or polish stop layer. Alternatively, the nanoparticle ILD may be sealed on the top surface by treatment with a nitrogen or argon plasma or inert ion beam surface treatment.

The nanoparticle ILD 12 will typically have a conductor 15 embedded in it. In advanced interconnect structures, the conductor 15 preferably comprises copper or its alloys, but in other applications the conductor may also comprise aluminum or other conductive materials. A diffusion barrier liner 14 may be disposed between nanoparticle ILD 12 and conductor 15. The diffusion barrier liner 14 typically comprises one or more layers of tantalum, titanium, tungsten, or nitrides of these metals. The diffusion barrier liner could also be a polymer, a so-called zero-thickness liner, a nanoparticle material or a bulk material deposited by chemical vapor deposition, such as BCN.

The top surface of conductor 15 is made coplanar with the top surface of the silicon nitride layer 13, usually through chemical-mechanical polishing (CMP). A cap layer 17, which may comprise a material such as SiCN, CoWP, or CoWB, is disposed on the conductor 15 and on the silicon nitride layer 13. The cap layer 17 acts as a diffusion barrier to prevent the diffusion of copper from the conductor 15 into the surrounding dielectric material. The cap layer may also act as an etch stop layer.

A first interconnect level is defined by the adhesion promoter layer 11, nanoparticle ILD 12, silicon nitride layer 13, diffusion barrier liner 14, conductor 15, and cap layer 17 in the interconnect structure shown in FIG. 1. A second interconnect level, shown above the first interconnect level in FIG. 1, includes adhesion promoter layer 18, nanoparticle ILD 19, silicon nitride layer 20, diffusion barrier liner 21, conductor 22, and cap layer 24. The first and second interconnect levels may be formed by conventional damascene processes, as explained in greater detail below.

The methodologies described herein for forming and defining the nanoparticle ILDs 12 and 19 in the structure depicted in FIG. 1 can be better understood by first considering, and contrasting them to, the prior art process for forming nanoparticle layers as illustrated in FIGS. 2 to 5.

Figure 2:
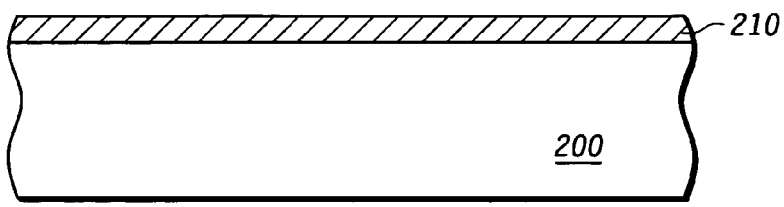
FIGS. 2-5 are cross-sectional views illustrating a prior art process for making a dielectric layer.

As depicted in FIG. 2, in this prior art process, a catalytic layer 210 is formed on the substrate 200. The catalytic layer is typically formed through physical vapor deposition or chemical vapor deposition.

Figure 3:
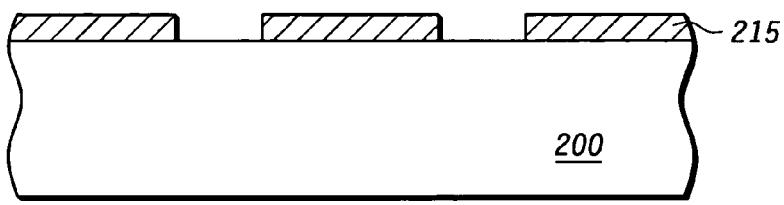

As depicted in FIG. 3, after the catalytic layer 210 is formed, it is patterned through photolithography and etching to form a patterned catalytic layer 215. The catalytic layer 210 is etched through reactive ion etching (RIE) using a chlorine containing gas as the etching plasma gas source to form volatile metal chlorides. Thereafter, the catalytic layer surface is cleaned using hydrogen plasma or argon plasma.

Figure 4:
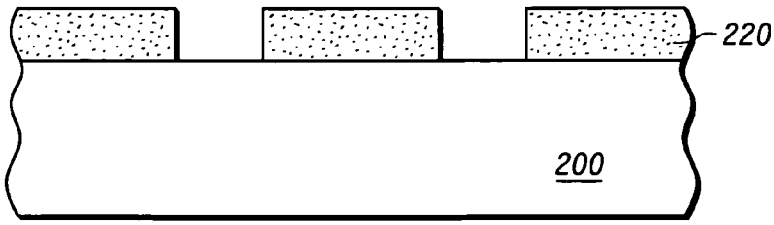

Next, as shown in FIG. 4, a patterned nanotube thin film layer 220 is formed on the surface of the catalytic layer 215. Purportedly, during the formation of the nanotube thin film layer 220, the patterned catalytic layer gradually spreads to the top of the nanotube layer along the growing of the nanotube wall, and eventually enters the gaseous environment outside the nanotube thin film layer 220. As a result, the catalytic layer 215 is said to eventually disappear from the structure. Nonetheless, since the nanotube layer only grows initially on the surface of the patterned catalytic layer 215, and only grows thereafter on the nanotube material that was previously deposited, the nanotube thin film layer 220 replicates the initial pattern of the catalytic layer 215.

Figure 5:
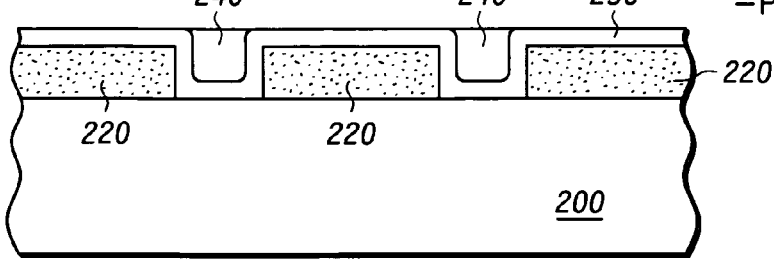

As shown in FIG. 5, after the nanotube thin film layer 220 is formed, a conformal barrier layer 230 of Ti/TiN, Ta/TaN or WN is sputtered onto the substrate 200 and onto the nanotube thin film layer 220. Next, a metal layer 240, which may be copper, is formed by sputtering deposition or chemical vapor deposition. Typically, any portion of the metal layer 240 that extends above the barrier layer 230 is removed through chemical mechanical polishing or etching-back such that the metal layer 240 has a flattened surface.

Without wishing to be bound by theory, it is believed that methods for making nanoparticle interlayer dielectrics of the type illustrated in FIGS. 2-5 are flawed in that these methods rely on the use of metal-based catalyst materials to build up the dielectric layer. Consequently, the resulting layer is contaminated by catalyst residue, even if the catalyst layer itself is ultimately removed during the process. Such catalyst residues can have a dramatic and adverse impact on the dielectric properties of the layer. As a result, ILDs based on materials such as BNNT have significantly higher k-values, and less advantageous mechanical properties, than they are theoretically capable of achieving. Furthermore, depositing and patterning a sufficiently thin and uniform catalyst layer for all required metal layers is technologically challenging. In particular, thin metal layers have a pronounced tendency to deposit as grainy layers, discontinuous deposits or "balls" rather than as continuous films. Moreover, the additional deposition and patterning steps required by the use of a catalyst layer makes this approach economically unfeasible for BEOL processes.

It has now been found that, by creating purified suspensions or solutions of nanoparticles and then using these purified suspensions or solutions to construct the dielectric layer, as through evaporative processes such as spin coating or through other suitable processes, a dielectric layer which is free of catalyst contamination can be produced. The resulting layers have physical characteristics that are often markedly better than similar layers formed by a catalyst deposition method. In the case of BNNT, for example, the resulting layer is observed to have reproducible dielectric constants that are significantly lower than the k-values observed in dielectric layers formed by catalyst growth methodologies such as that depicted in FIGS. 2-5. As an added benefit, dielectric layers formed by this method have appealing material, microscopic, electrical, and process integration properties, such as exceptionally high Young's moduli, that are superior to the properties observed in their catalyst grown counterparts.

Another benefit of the approach described herein is that the resulting dielectric layer can then be etched to form an appropriately patterned dielectric layer. By contrast, catalyst-based methods require that the catalyst layer itself be patterned before the dielectric layer is grown upon it, an approach that results in extra processing steps and also increases the amount of catalyst contamination in the resulting system. This process is complicated by the fact that catalysts are typically difficult to etch. Moreover, many commonly used metal catalysts, such as Pt, form low volatility fluorides, chlorides and carbonyls. There is thus the added risk of particle contamination and cross-contamination with other processes. This is especially true with regard to the processes related to lithography since, in many fabrication lines, all of the wafers will have to pass through a single lithographic exposure/patterning tool.

Figure 6:
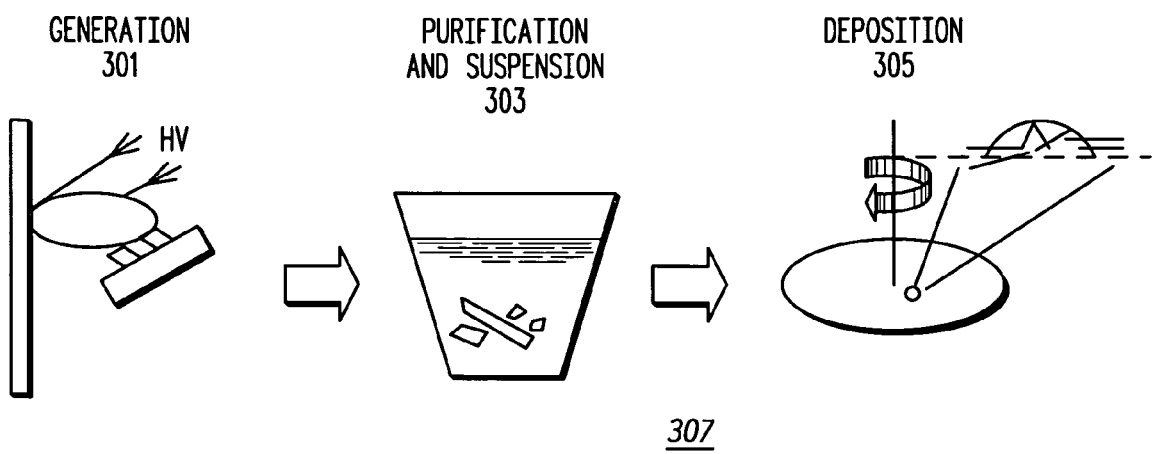
FIG. 6 is an illustration of a method for making a dielectric layer in accordance with the teachings herein.

One non-limiting embodiment of a methodology suitable for the formation of nanoparticle dielectric layers in accordance with the teachings herein is illustrated in FIG. 6. As shown therein, the nanoparticles are generated 301 from bulk material by laser ablation or through other suitable means. Typically, this step will involve the steps of growing the particles on a suitable surface, and then collecting them. The nanoparticles may be initially grown or formed using any of the techniques as are known to the art, including, but not limited to, laser ablation, ball milling, chemical vapor deposition, or arc-discharge techniques.

The generated particles are then purified and suspended 303 in a liquid medium. The purification process may be a single step process (for example, the step of forming the suspension may itself effectively purify the particles, especially if the liquid medium does not solvate or suspend the impurities), or it may be a multiple step process. The exact choice of purification technique may depend on such factors as the specific composition or chemistry of the nanoparticle material, the manner in which it was formed, and the types of impurities to be removed.

As a specific example of a purification technique that may be utilized prior to forming the suspension, the nanoparticles may be washed with a solvent that selectively dissolves or removes any metal catalyst impurities that may be present. The nanoparticles may also be purified by a suitable evaporative technique such as sublimation, or through recrystallization.

One particular technique that is useful in purifying some nanoparticle materials involves placing the material in a suitable liquid medium, such as methanol or another organic solvent, and keeping the material in suspension within the liquid medium for a prolonged period of time using sonication techniques. This technique may be supplemented, if necessary, by passing the suspension through a micro porous membrane.

Another technique that can be used to purify some nanoparticle materials involves refluxing the particles in a suitable solvent, such as $H_2O_2$, with subsequent rinsing in additional liquids or solvents (such as, for example, $CS_2$ or methanol), followed by filtration. This later approach has been described in Tang et al., *Science*, Vol. 288, 492 (2000).

A number of materials may be used as the liquid medium in the methodologies described herein, with the exact choice of material depending in part on such factors as the chemical composition of the nanoparticles and their average particle size. Preferably, the liquid medium is an aqueous medium, which may be, for example, pure distilled water or an aqueous mixture of one or more other materials. A variety of other media may also be used, including, but not limited to, alcohols (including, for example, methanol, ethanol, and isopropyl alcohol), peroxides (including both hydrogen peroxide and organic peroxides), polyols, polyvinylpyrrolidone, polar or nonpolar organic solvents (such as, for example, methylene chloride and $CS_2$), and the like. Various mixtures of the foregoing may also be used as the liquid medium. Formation of the suspension may be facilitated with sonication, heating, reflux, or other techniques as are known to the art.

After the purified suspension is formed, it may be used to generate a dielectric layer 305 on a substrate through a number of suitable techniques, including both evaporative and non-evaporative processes. Preferably, the dielectric layer is formed through a spin coating process. As indicated in FIG. 6, this process involves applying one or more droplets of the suspension to a substrate which is then rotated about an axis. A certain amount of re-growth or continued growth of the nanoparticles may occur as part of this spin-coating process. This process may also result, in some instances, in the alignment of the nanoparticles along a common axis, which may improve the physical characteristics of the resulting layer. In some embodiments, the spin coating process may also include heating or curing steps. The spin coating process can be a single process, a sequence of processes, or a combination of processes, such as adhesion layer formation followed by spin coating to form a laminate.

After the dielectric layer is initially formed, it may be patterned as necessary to form the final device. One specific, non-limiting embodiment of this process is illustrated in FIGS. 7-10 (the structures in these figures have been simplified for ease of illustration) in reference to a dielectric layer comprising BNNT. Of course, one skilled in the art will appreciate that several variations in this process are possible, and that the process may be modified appropriately to accommodate other nanoparticle materials.

Figure 7:
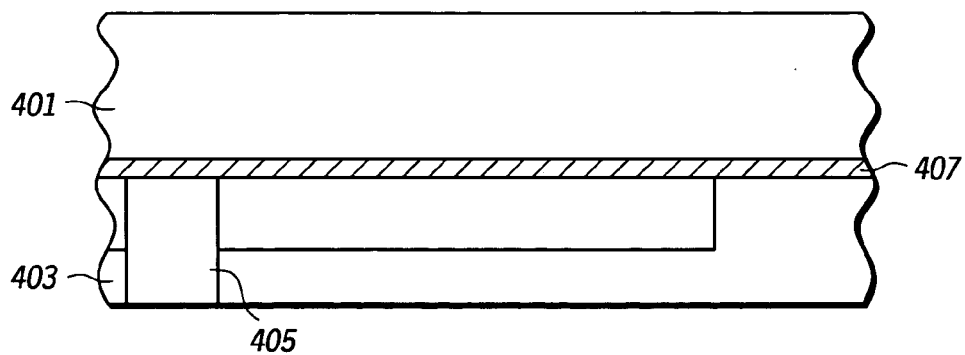
FIGS. 7-10 illustrate a method for selectively etching a dielectric layer in accordance with the teachings herein.

With reference to FIG. 7, a structure 401 is depicted which features a dielectric layer 403 comprising BNNT. The dielectric layer 403 may be formed, for example, through a spin coating process as described above. The structure further includes a copper interconnect 405 over which is disposed a barrier layer 407. The barrier layer 407 serves to prevent copper from diffusing into the surrounding materials from the interconnect during subsequent processing steps. It also prevents reaction between the copper interconnect 405 and the plasma used in subsequent etching steps (see FIG. 8).

Figure 8:
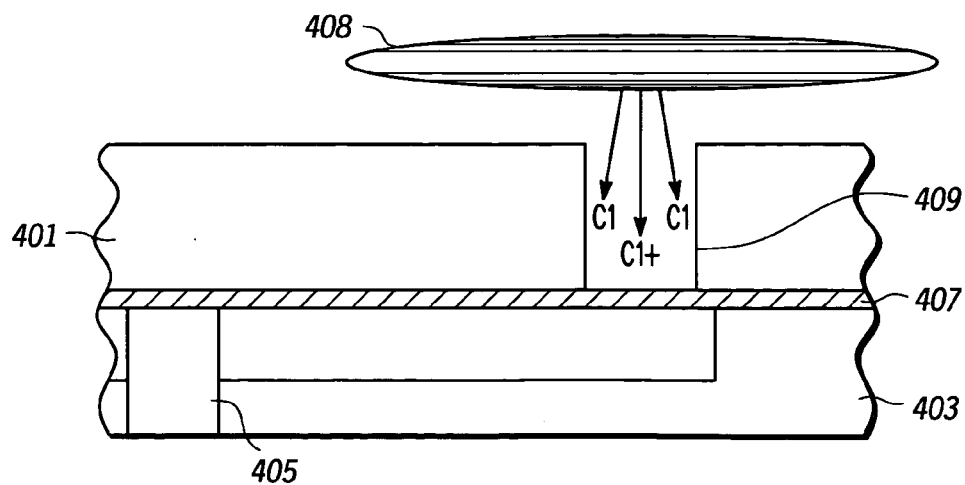

With reference to FIG. 8, the dielectric layer 401 may be suitably masked with a photoresist or masking material (not shown), and the exposed portions of the layer may then be etched appropriately to define any desired vias 409, trenches, or other openings therein. Preferably, the etching is accomplished using a halogen plasma 408 and, more particularly, a chlorine plasma, though other techniques as are known to the art may also be utilized. If a chlorine plasma etch is used, the material of the barrier layer 407 is preferably chosen to provide suitable etch stop behavior for this process. A separate etch can be used for removal of the exposed barrier layer in applications where this is required or desired.

Figure 9:
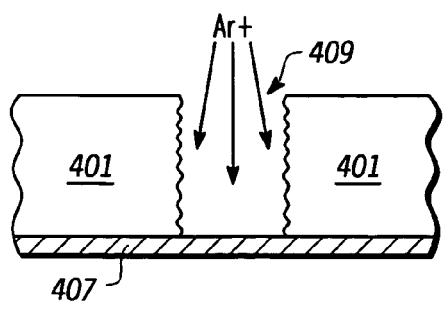

As shown in FIG. 9, after the via 409 is formed, the newly exposed surface of the via may be subjected to a cleaning and/or sealing process. This may be achieved, for example, by treatment of these surfaces with an argon plasma, which has the effect of collapsing any exposed nanotubes and sealing the surfaces of the via.

Figure 10:
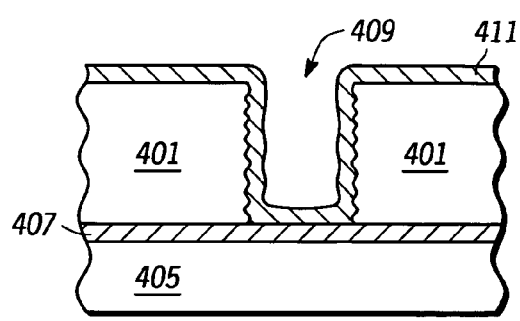

Referring to FIG. 10, the treated surface shown in FIG. 9 is then subjected to a deposition process such that a diffusion barrier layer 411 is formed thereon. The diffusion barrier layer (which may comprise, for example, BCN or another suitable material) is depicted as being in contact with the copper interconnect 405. However, it will be understood that, in some applications, it may be desirable to leave the barrier layer 407 intact, in which case the diffusion barrier layer 411 will be disposed over barrier layer 407.

Figure 11:
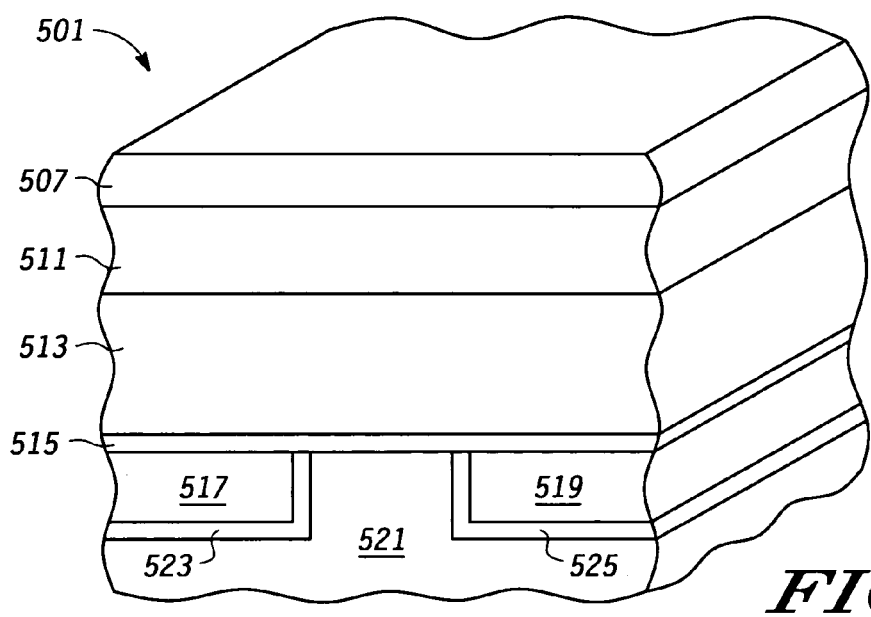
FIGS. 11-20 illustrate a method for making a device containing BNNT ILDs in a BEOL process.
Figure 17:
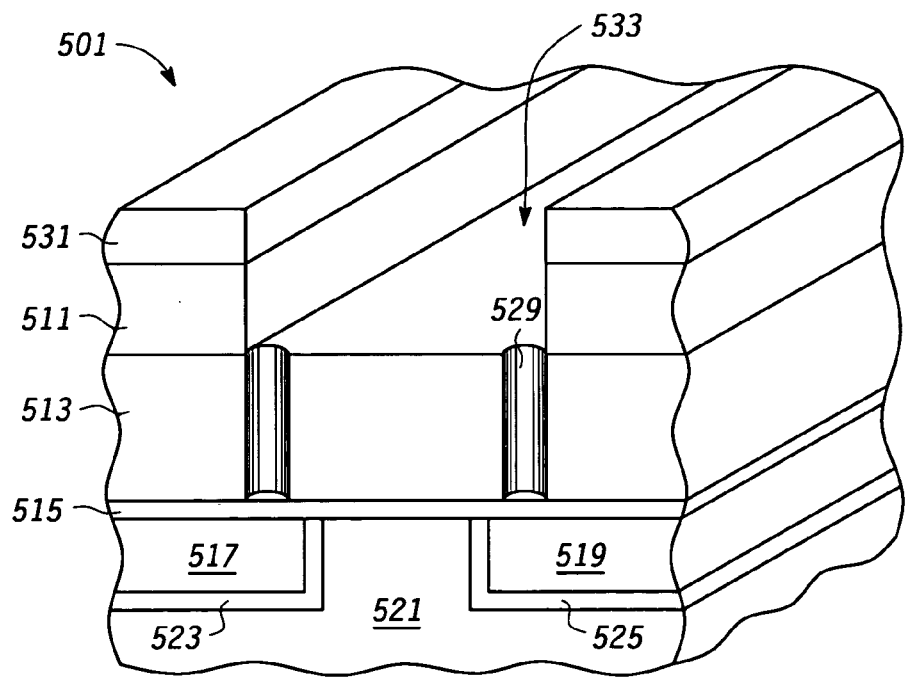
Figure 18:
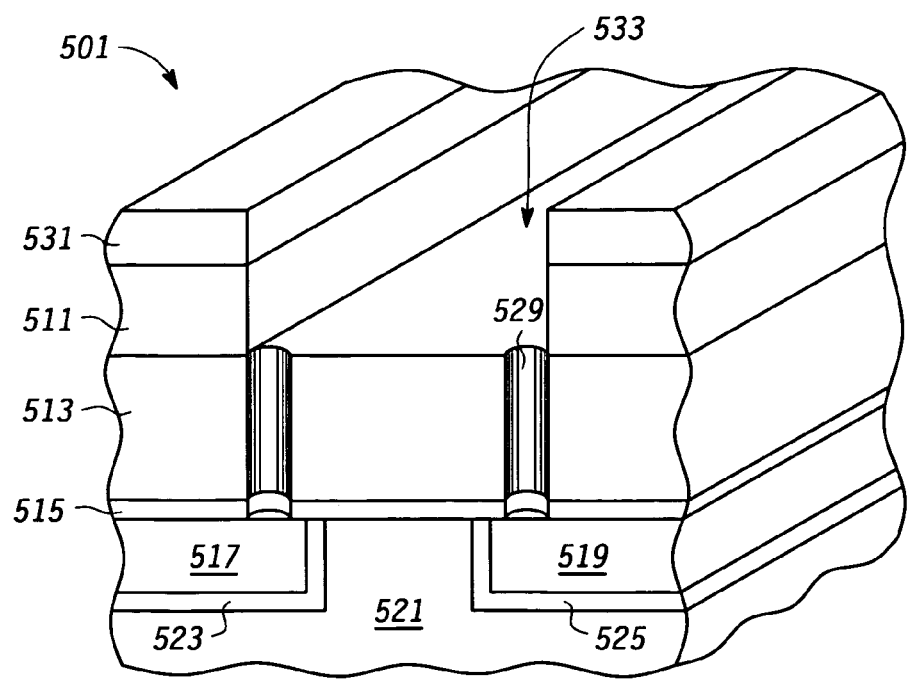
Figure 19:
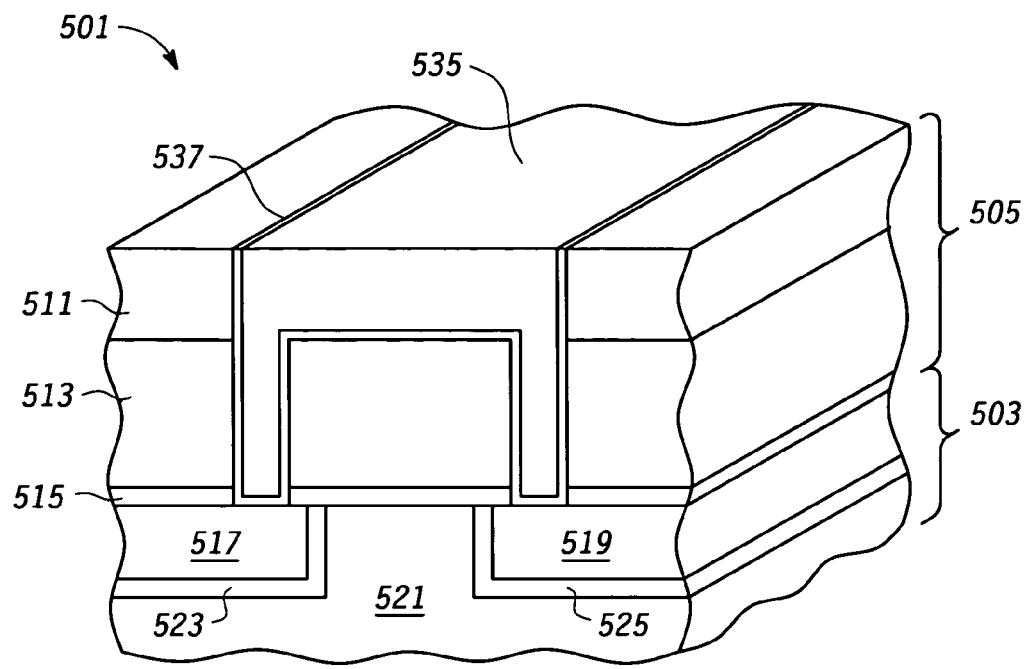

FIGS. 11-19 illustrate the application of the general methodology depicted in FIGS. 7-10 to the fabrication of a more complicated structure 501 having single inlaid 503 and dual inlaid 505 components (see FIG. 19). With reference to FIG. 11, and going from top to bottom, the device comprises a layer of photoresist 507; a hybrid dielectric layer consisting of a first dielectric layer 511 comprising BNNT disposed over a second dielectric layer 513 comprising TEOS, SiCOH or another suitable dielectric; a cap or etch stop layer 515; copper conductors 517, 519; a dielectric 521 comprising BNNT which is disposed between and underneath copper conductors 517, 519; and diffusion layers 523, 525 disposed, respectively, between copper conductors 517, 519 and dielectric layer 521. Diffusion layers 523, 525 will typically comprise dual layers of Ta/TaN, but may also comprise other materials which resist the diffusion of copper into adjacent layers or structures.

Figure 12:
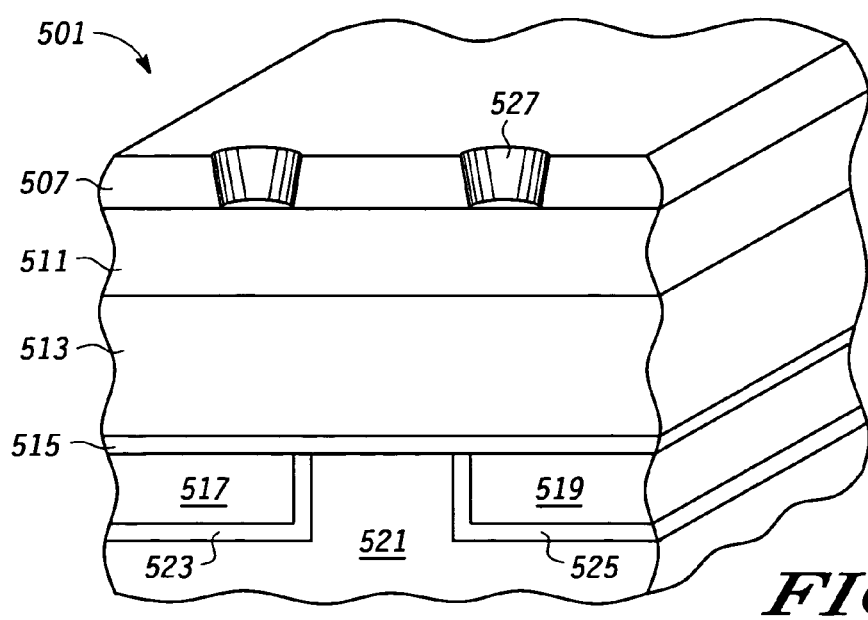
Figure 13:
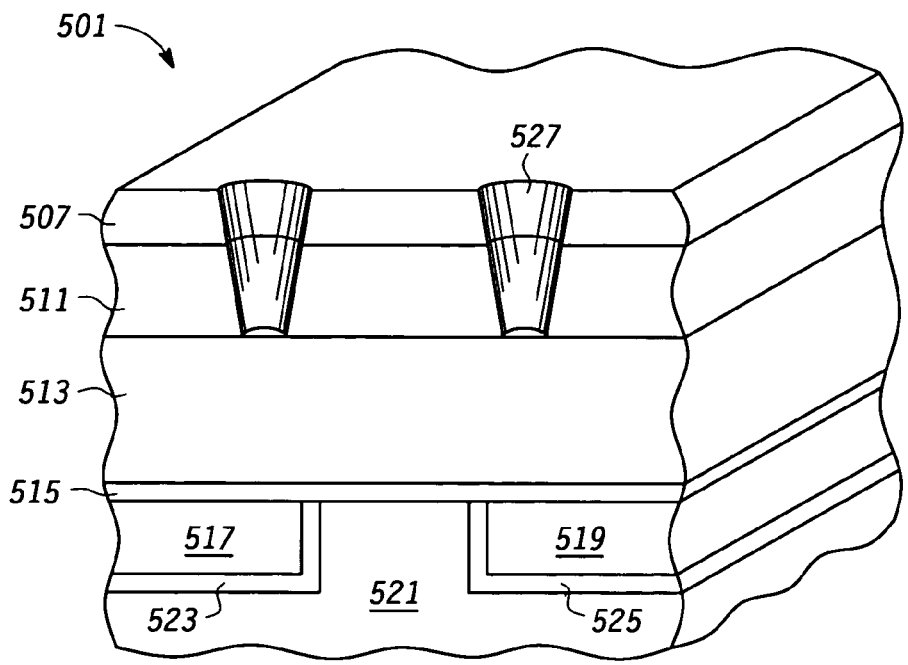
Figure 14:
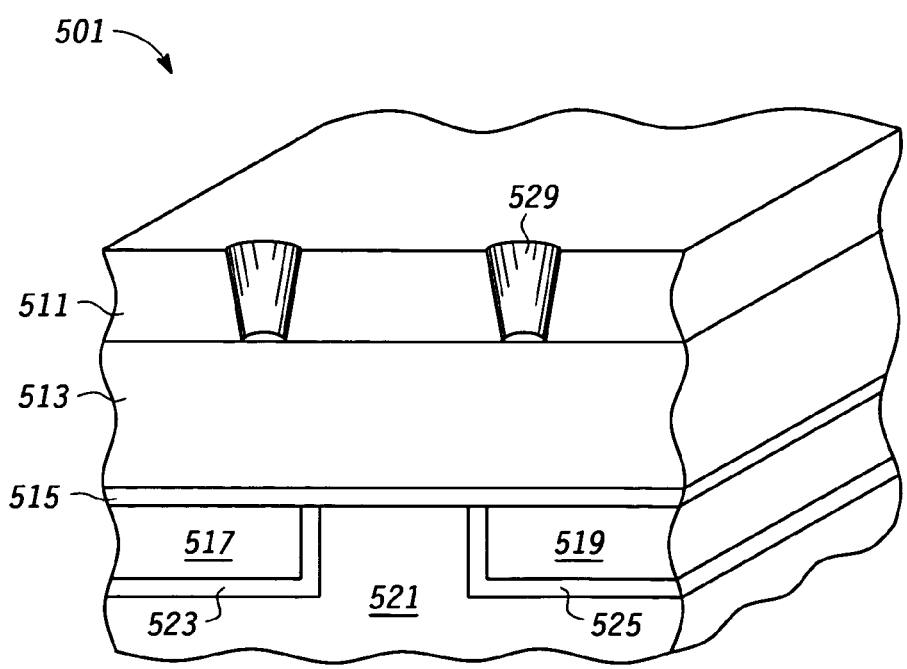

Referring now to FIG. 12, the layer of photoresist is subsequently patterned to form openings 527 therein. The exposed first dielectric layer 511 is then etched with a chlorine plasma or other suitable plasma to expose the underlying second dielectric layer 513, as shown in FIG. 13, thereby forming vias 529. As previously noted, this step of the process may further include cleaning and/or sealing steps, such as, for example, treatment of the exposed BNNT surfaces with an argon plasma, to collapse any exposed nanotubes and to seal the surfaces of the via 529. Other sealing processes, such as the deposition of a BCN layer or paralyne layer over the surface, can also be used. The layer of photoresist 507 is then stripped as shown in FIG. 14.

Figure 15:
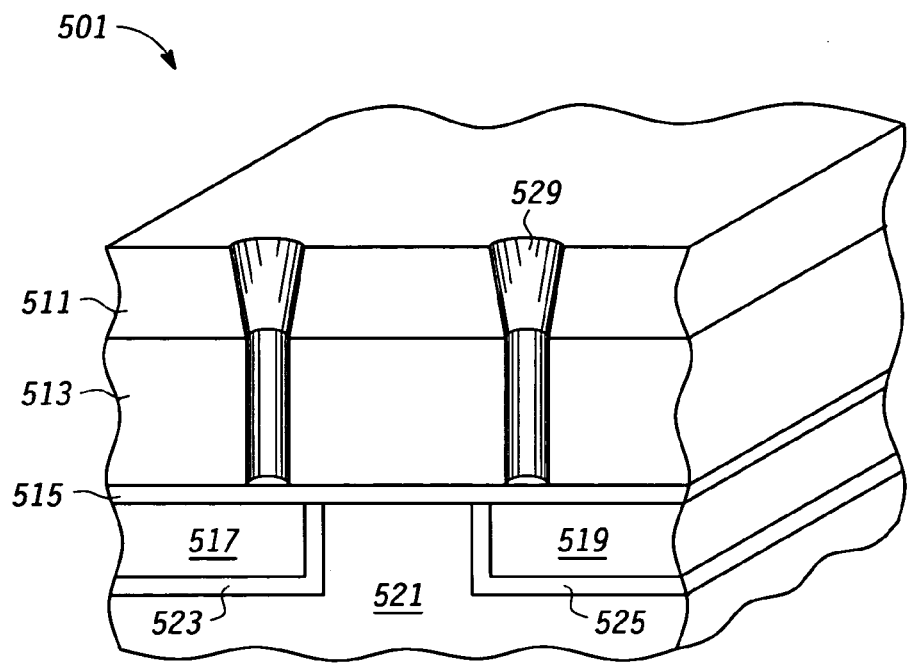

As shown in FIG. 15, the exposed second dielectric layer 513 is then etched with a suitable etchant such as $C_xF_y$ (the stoichiometry here would typically be selected based on the particular composition of the second dielectric layer). The particular choice of etchant is preferably selected to exhibit selectivity toward etch stop layer 515 and to provide adequate profile control.

Figure 16:
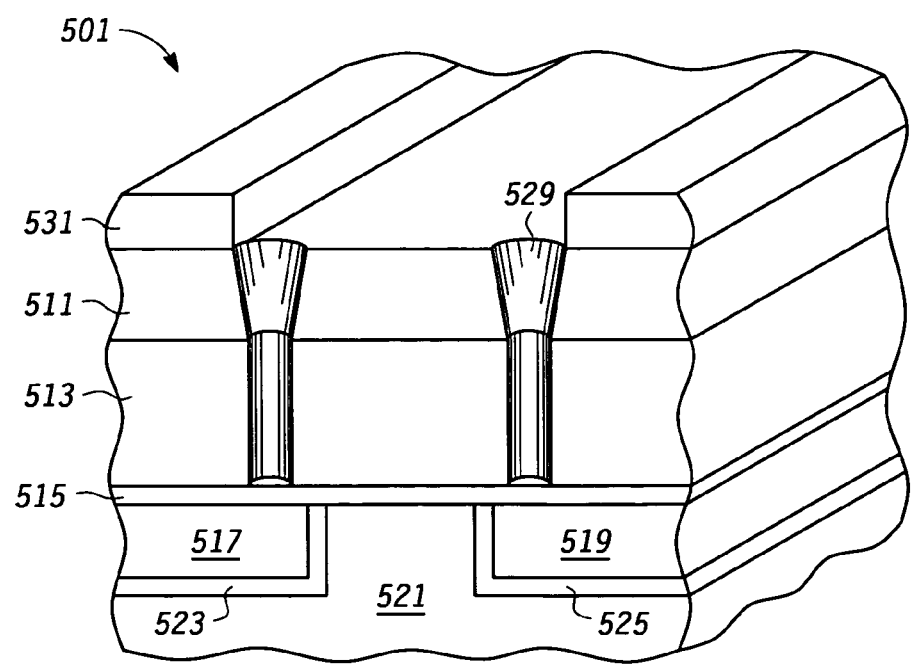

As shown in FIG. 16, the first dielectric layer 511 is then masked with a layer of photoresist 531 or other suitable material. As shown in FIG. 17, the exposed portion of the first dielectric layer 511 is then removed with a chlorine plasma or other suitable etch, thereby defining a trench 533. The vias are then extended through etch stop layer 515 with a suitable metal etch, as shown in FIG. 18. The result of this process is a very well defined trench/via structure which extends to copper conductors 517, 519.

Figure 20:
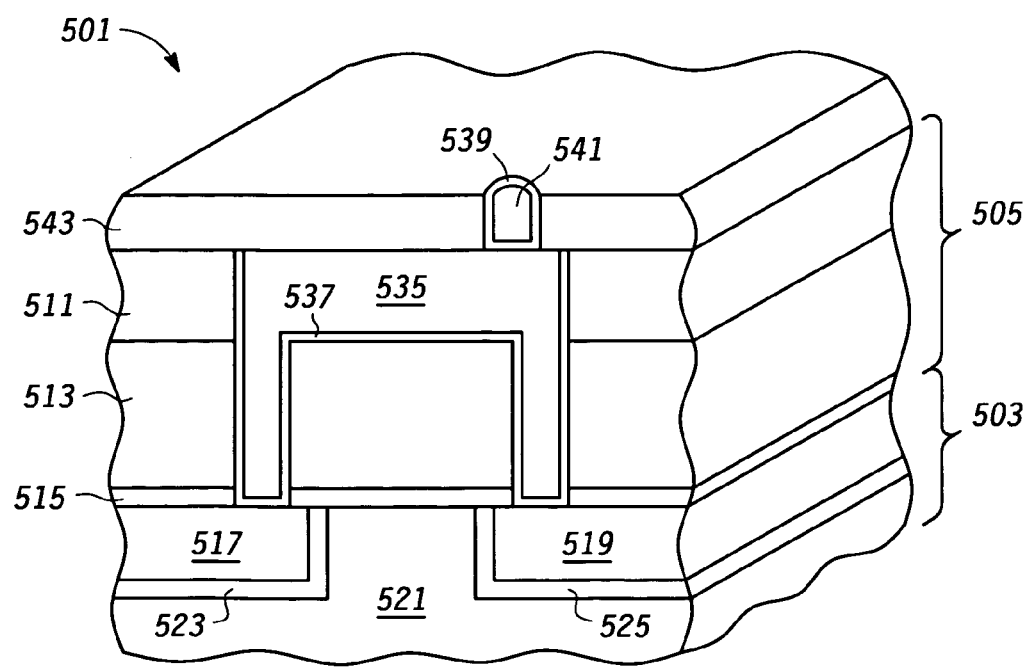

The trench and vias are then backfilled with copper 535 or another suitable conductor, as shown in FIG. 19. This may be accomplished by vapor deposition, electroplating, or other suitable processes. Prior to backfilling, the surfaces of the trenches and vias are preferably lined with a diffusion barrier layer 537. As shown in FIG. 20, the device may then be subjected to further processing steps for the generation of additional trench metal and via metal levels. This is indicated by the addition of diffusion barrier layer 539 and conductor 541 defining the via in dielectric layer 543.

Figure 21:
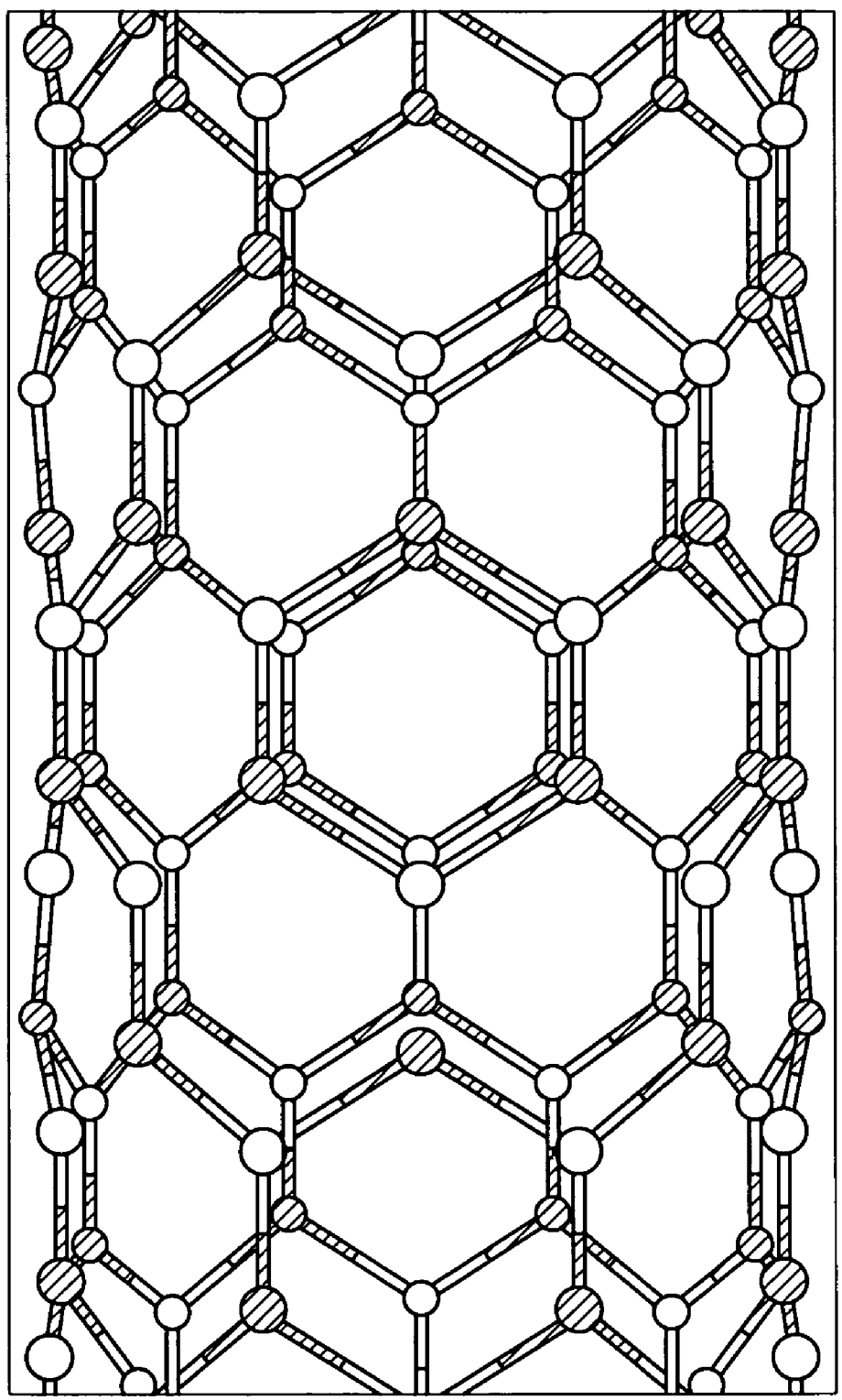
FIG. 21 is an illustrating depicting the molecular structure of a BNNT.

The physical properties of particular types of nanoparticles are an important consideration in their selection for use in the processes described herein, including the ILD formation processes described above. In particular, the polarizability of these materials is an important consideration, since it can have a significant impact on the ability of the nanoparticles to form a stable suspension. Polarizability of BN nanotubes has been reported in the literature. See, for example, J. Kongsted, A. Osted, L. Jensen, P. Astrand, K. Mikkelsen, "Frequency Dependent Polarizability of BN Nanotubes: A Theoretical Study", J. Phys. Chem., B, 105 10243 (2001), which is incorporated here by reference in its entirety. As explained therein, the polarizability of BN nanotubes, an example of which is depicted herein in FIG. 21, is dependent on the number of BN atoms in the tube. The dependence is linear with length and non-linear with increasing diameter, but is not seriously off-linear.

For a canonical nanotube with 100 atoms and a 9 angstrom by 9 angstrom unit cell (that is, a 9 angstrom length and diameter), the increment in number of atoms per unit length is $$N_{increase\_length} = 10l \quad \text{(EQUATION 1)}$$

where l is in angstroms, and the increment in number of atoms per unit of radial distance is $$N_{increas\_radius} = 11.3d \quad \text{(EQUATION 2)}$$

where d is the tube diameter in angstroms. For reference, the conversion between angstroms and a.u. is $$1 \text{ a.u.} \sim 0.5 \text{ angstroms} \quad \text{(EQUATION 3)}$$

Hence, the canonical tube has a polarizability of approximately 1000 (a.u.$^3$). The polarizability (units of volume) as a function of length and width is therefore $$\alpha = 25d + 22.5l \quad \text{(EQUATION 4)}$$

where the units are in a.u.

The unit cell of a nonotube depends on the nanotube type, which defines the nanotube volume. Comparing the unit cell volume with the polarization "volume" allows one to calculate the dielectric constant using the Clausius Mosotti Equation:

$$\frac{\varepsilon - 1}{\varepsilon + 2} = \frac{4\pi}{3} \frac{\alpha}{V} \quad \text{(EQUATION 5)}$$

(the high frequency terms have been dropped, since they are typically negligible). The term $\alpha/V$ can be calculated for BN nanotubes using the data from the Kongsted reference cited above. Upon doing so, it is found that $$\frac{\alpha}{V} \approx 5\left(\frac{1}{d} + \frac{l}{d^2}\right) \quad \text{(EQUATION 6)}$$

where l is the tube length (not the unit length).

It is to be noted that this calculation assumes the worst case scenario, that is, it assumes that the unit cell length is approximately 9 angstroms, which is the case for zig-zag and armchair nanotubes. However, the unit cell length is much longer for chiral nanotubes.

Consider a high k-value (20) tube and a low k-value (2) tube. EQUATION 5 then dictates that $\alpha/V \sim 0.2$ for a dielectric constant of 20, and that $\alpha/V \sim 0.08$ for a dielectric constant of 2. The tube "design" curve for dielectric constant 2 tubes is then:

$$\frac{l}{d} = d0.016 - 1 \quad \text{(EQUATION 7)}$$

The design curve for dielectric constant 20 tubes is then $$\frac{l}{d} = d0.04 - 1 \quad \text{(EQUATION 8)}$$

Figure 22:
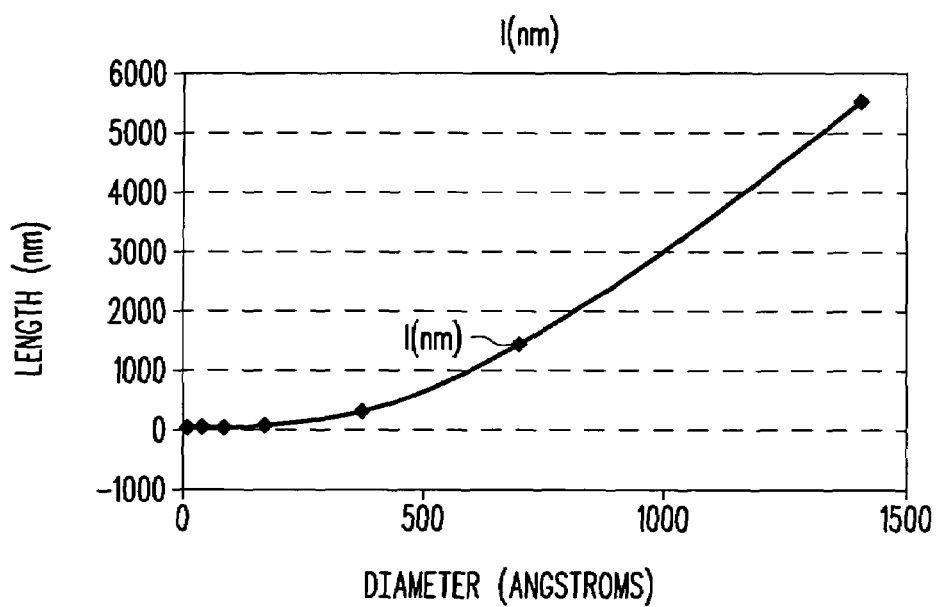
FIG. 22 is a graph of length as a function of diameter for BNNTs having a dielectric constant of 2.
Figure 23:
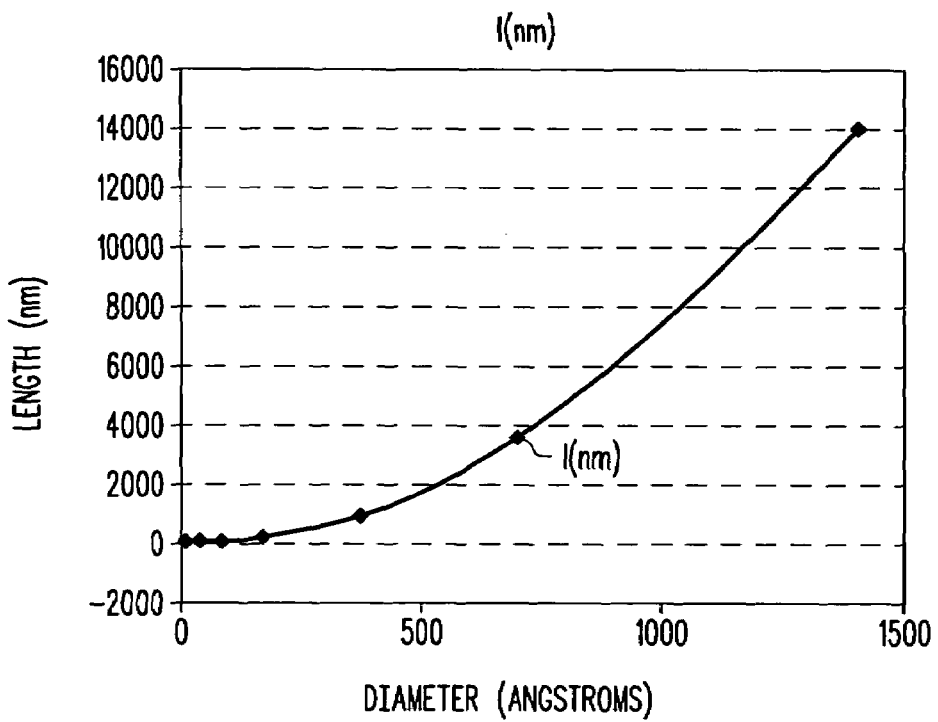
FIG. 23 is a graph of length as a function of diameter for BNNTs having a dielectric constant of 20.

The relationship between l and d for k=2 tubes is depicted in FIG. 22, while the same relationship for the k=20 curve is given in FIG. 23. These figures suggest that length engineering is required for the tubes of smallest unit cell. The length requirements are relaxed linearly with increasing unit cell length. Thus, for the most restrictive "unit cell" nanotube (i.e., a 10 angstrom diameter, 1 micron length tube), the tube can have a characteristic dielectric constant of 2 or lower. The requirement that the nanotubes be of a specific length and diameter can be relaxed somewhat by assuming that the nanotube film will have some porosity and bulk BN contribution.

A number of techniques may be employed to adjust the dimensions of nanotubes and other nanoparticles after their formation. These techniques can be used, for example, to achieve nanoparticles having a desired distribution of lengths and diameters as described above. Thus, for example, in some instances, prolonged sonication of nanoparticles in a suitable medium has been found to reduce the dimensions of the particles. As a specific example of this approach, sonication of carbon nanotubes in a mixture of concentrated sulfuric and nitric acids has been observed to systematically shorten the length distribution of the carbon nanotubes as a function of exposure time to the acid. This methodology is described more fully in Jie Liu et al., "Fullerene Pipes", *Science*, Vol. 280, pp. 1253-1256 (May 22, 1998).

Another technique that may be useful in some applications for reducing the dimensions of nanoparticles utilizes diamond particles as an abrasive material for cutting the nanoparticles. This technique is described more fully in L. Stepanek et al., "Nano-Mechanical Cutting and Opening of Single Wall Carbon Nanotubes", *Chem. Phys. Lett.*, 2000, 331, 125-131. In this technique, diamond particles are used to effectively grind the nanoparticles in order to cut them into shortened particles.

In a further technique, a soft cutting agent, such as a cyclodextrin, may be used to reduce the dimensions of the nanoparticles. This approach is particularly suitable where the smaller particles have greater solubility in the cutting agent than the larger particles, because the reduction in dimensions of the nanoparticles is often observed to slow or stop as solvation occurs. In some applications, this technique may be used in combination with a physical grinding technique, such as the technique of Stepanek et al.

In some embodiments of the methodologies and devices disclosed herein, the dielectric layer may consist of multiple layers of nanoparticles. For nanoparticles that adhere to one another well, these multilayer structures will typically have the dielectric constant of bulk BN over the adhering volume, but may have mechanical properties that differ from a monolithic layer of the material having the same dimensions.

Various means may be used to produce nanoparticles for use in the methodologies and devices described herein. Such means include, but are not limited to, laser ablation, DC discharge, plasma enhanced chemical vapor deposition (PECVD), CND, atom beam deposition, and milling and post annealing growth methods.

In the case of BN nanotubes, these materials may be deposited from milled BN grown after annealing (annealing is typically conducted at about 1200° C.). BNNT can be grown in this manner free of contaminants or metal catalyst particles. BNNTs may be generated by ablation of bulk BN, and may then be collected and purified. BNNTs may also be readily suspended in water and subsequently deposited and grown into BNNT membranes through evaporation. This approach has been used to form well defined membranes from BNNTs. Thus, for example, 0.2 mg/ml suspensions have been used to generate a membrane consisting of 0.5 micron length tubes.

In the process steps described herein which require the etching of BNNTs, various methodologies and materials may be used for this purpose. Preferably, such etching is achieved through the use of chlorine plasma etching, though particular applications may dictate different etching chemistries. For example, the use of sufficiently polymerizing fluorocarbon plasmas, driven with appropriate ion energy to preserve anisotropy, may be beneficial in some applications because such plasmas are self-sealing. By contrast, chlorine plasmas tend to be characterized by etching mediated by a passivated surface with a relatively thin "chlorinated layer" and, as such, may not self seal. However, this typically does not lead to radial etching, as neutral driven etching (sidewalls) is slow. Even though, in the case of $Cl_2$ plasmas, the surface may not seal as when a polymer layer is deposited from a CxFy based plasma, ion bombardment may collapse any open structures, thereby resulting in sealing.

Material penetration post-etch processes can be dealt with, in some instances, by coating the nanoparticles with silica, since silica has been demonstrated to adhere well to certain types of nanoparticles. The existence of poor anisotropy in the etching process can be dealt with through a Bosch-like etch process in which isotropic processes can be used to yield highly anisotropic etch features. Alternatively, if trench and via walls are sufficiently sloped, an argon plasma may be used to morphologically damage the surface and collapse the open tubes.

Applying a Bosch etch process to the process integration around a BNNT interconnect could be used to address issues beyond profile control, such as pore sealing. For example, halogen etch steps could be alternated with argon etch steps designed to close pores as the halogen etch progresses. Alternatively, it may be desirable to round the corners of a trench opening to enhance subsequent barrier coverage. It may be undesirable to do this after etching is completed and the trench and vias in an interconnect structure have opened to another metal layer through the etch stop layer. The process of etching the corners or vias to form facets may sputter the bottom of the BNNT via or trench structure depositing sealing BN material on the sidewalls, further enhancing sidewall sealing. In a more traditional Bosch etch process, a halogen based etch process may be alternated with a plasma process that is substantially a deposition process such as a process that would deposit BCN, paralyne or polymer generated by a c-C4F8, C4F6 or c-C5F8 plasma. The action of etching during the non-depositing etch steps would remove deposit from the bottom of the BNNT interconnect structure. Varying degrees of sidewall deposition during the deposition step could enable novel interconnect structures such as a wine-glass profile or other profiles desired for interconnect reliability imperatives.

The dielectric layers made in accordance with the teachings herein exhibit a number of very desirable properties. For example, dielectric films based on BNNTs are insulating with a band gap that is ~5 eV. Moreover, and in contrast to carbon nanotubes (CNTs), the electronic properties of BNNTs are typically independent of nanotube size (radius and length), and are also typically independent of whether the tubes are multi-walled or not, although they can be significantly affected by radial defects akin to "pimples".

The nanoparticles employed in the methodologies and devices described herein can be made to occur in many configurations. Thus, for example, BNNTs may be produced in the form of long ropes or filaments of up to 40 microns in length (2-10 nm in diameter), to lengths in the sub-micron region. Zig-zag nanotubes and open and closed-end nanotubes may also be produced. Other nanoparticles can be made to form balls, horns and other such shapes.

Dielectric layers based on BNNTs can be produced in accordance with the teachings herein which have very desirable mechanical properties. Thus, for example, dielectric layers can be produced in accordance with the teachings herein that have Young's moduli within the range of about 1.1 to about 1.3 TPa. BNNTs are also more found to be more resistant to strain induced defects than their CNT counterparts, and exhibit greater mechanical strength than BN films that are not based on nanoparticles. Without wishing to be bound by theory, it is believed that the stiffness of BNNTs may make up for the buckling tendency of the pure BN film, while offering mechanical advantages from the perspective of materials processing (i.e., planarization with CMP).

Various dielectric layers may be made in accordance with the teachings herein. These layers may be formed in a single deposition process, or may be built up through multiple depositions, using the same or different suspensions, to achieve multilayer structures. For example, deposition of BNNT may be alternated with deposition of diverse materials, such as silicon nitride. Also, layers of BNNT having differing thicknesses may be formed by the stepwise deposition of BNNT using suspensions of differing concentrations, or by using different amounts of suspensions having the same concentration. Multilayered structures may also be formed in accordance with the teachings herein wherein different layers comprise different nanoparticles. Thus, for example, multilayered structures may be formed which consist of alternating BNNT and CNT layers.

While the nanoparticle layers described herein, especially those based on BNNT, are particularly useful in a damascene process, it is to be understood that the methodology and dielectric layers described herein are more broadly useful, and hence have use in many applications requiring high strength and/or low-k layers.

Thus, for example, the methodologies disclosed herein may be suitably adapted to produce layers and structures in other applications and devices. One such application is in the fabrication of microelectromechanical structures (MEMS), where nanoparticle-based materials may be used, for example, to produce walls in trench perimeter schemes, and/or may be used to produce anchor portions of MEMS structures. As a specific example, BNNTs may be used to construct a strong, low-k dielectric anchor in a MEMS device.

Figure 24:
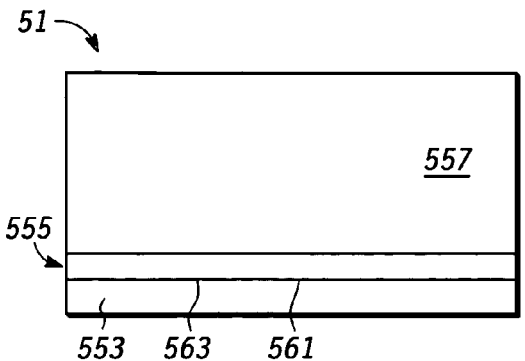
FIGS. 24-28 are cross-sectional illustrations depicting a method for forming an anchor portion of a MEMS structure in accordance with the teachings herein.

FIGS. 24-28 illustrate one specific, non-limiting embodiment of the application of the principles described herein to a trench perimeter scheme for a MEMS device. As shown in FIG. 24, a structure 551 is provided which consists of a substrate 553 (typically silicon) having a sacrificial oxide layer 555 (typically silicon dioxide) disposed thereon, and having a layer of silicon 557 disposed on the sacrificial oxide layer. In a typical device, the silicon may have a thickness of about 20 microns and the sacrificial oxide layer may have a thickness of about 2 microns, though the present methodology is not limited to any particular layer thicknesses.

Figure 25:
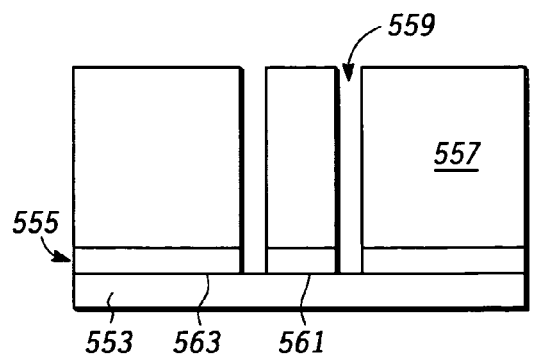

As shown in FIG. 25, a perimeter trench 559, which defines the perimeter of the anchor portion of the MEMS device, has been created in the structure through masking and etching steps (not shown). Since the figure is a cross-section, the trench appears as two separate structures; however, these structures are actually just opposite sides of a single perimeter trench that extends around the perimeter of the desired anchor portion of the device. The masking step typically involves applying a masking material to the structure and then exposing and developing the material to create a mask. The portion of the structure which is exposed by the mask is then subjected to an appropriate etching process, such as deep Reactive Ion Etching (RIE), to etch through the silicon, followed by an oxide etch to etch through the sacrificial oxide layer. The resulting trench divides the sacrificial oxide layer into an inner portion 561 which forms part of the anchor portion of the device, and an outer portion 563 which is removed in subsequent processing to release the SOI structure. The trench may also extend partially into the substrate 553.

Figure 26:
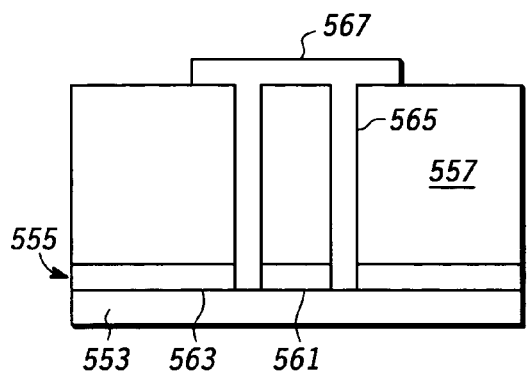

As shown in FIG. 26, a nanoparticle layer 565, which is preferably a dielectric layer based on BNNT, is formed over the trenched substrate through an evaporative process such as spin coating, or by another suitable method. In some instances, the nanoparticle layer may be doped to reduce the electrical resistance of the material if desired for the intended end use of the device. After the nanoparticle layer is deposited, it is masked (not shown) and patterned (e.g., using a chlorine plasma) so that, in the resulting structure, the nanoparticle layer fills the trench and extends laterally over a portion of the surface of the SOI so as to form a roof 567 over a portion of the surface of the SOI.

Figure 27:
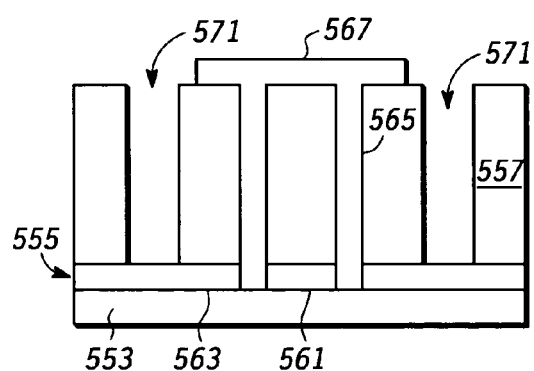

After deposition of the nanoparticle layer and patterning of roof 567, an outline mask (not shown) is used in conjunction with a suitable etching technique such as deep reaction ion etching to create a second trench 571 outside of the perimeter of the first trench, as shown in FIG. 27. The second trench extends down to the sacrificial oxide layer. The chemistry of the etch and/or the etching conditions may be selected such that the sacrificial oxide layer acts as an etch stop during the creation of the second trench.

Figure 28:
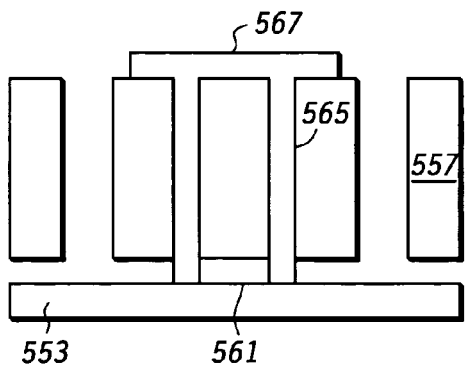

As shown in FIG. 28, the sacrificial oxide layer is removed by etching to achieve release of the SOI structure (the portions of silicon shown on the left and right hand side of the figure form portions of adjacent cantilevered structures that are similar to the cantilevered structure shown in the center of the figure). The etch may be chosen to be selective to the nanoparticle layer, such that the anchor portion 561 of the sacrificial oxide layer is substantially unaffected by the etch. The resulting anchor can thus be made with significantly improved mechanical properties, such as a greatly improved Young's modulus, which can materially improve the durability of the device. Moreover, the diameter of the anchor is predictable and reproducible, since it is not affected by the etch.

It will also be appreciated that, if desired, the anchor portion of the device can be made entirely out of the nanoparticle material. In this case, rather than creating a perimeter trench 559 as shown in FIG. 25, a depression having the dimensions of the desired anchor portion can be created. This depression can then be filled with the nanoparticle material using one of the techniques described herein. In instances where the purity of the nanoparticle anchor is not as important (e.g., when the dielectric constant can be higher than that provided by the pure nanoparticle material, and/or when some reduction in mechanical performance can be tolerated), the anchor portion can also be grown with the aid of a catalyst material using an approach similar to that depicted in FIGS. 2-5.

The methodologies disclosed herein have been described primarily as they relate to the formation of dielectric layers and structures. It will be appreciated, however, that the purification techniques disclosed herein are generally applicable to the formation of high-purity layers and structures. The actual dielectric properties will depend, among other things, on the choice of nanoparticles employed in the material. Thus, for example, the principles described herein may also be used to generate high-purity layers or structures that are conducting or semi-conducting. This may be accomplished, for example, through the use of carbon nanotubes.

Figure 29:
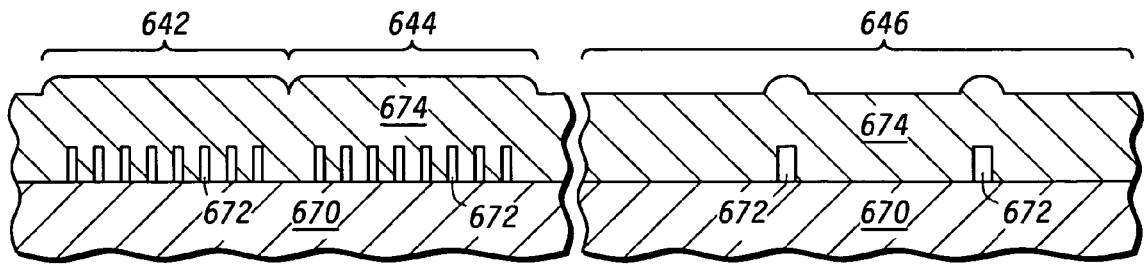
FIGS. 29-31 are cross-sectional illustrations depicting a method for controlling planarization in a chemical mechanical polishing process in accordance with the teachings herein.

The compositions and methodologies described herein may also be applied to the formation of tiling or other structures for the control of CMP. FIG. 29 includes an illustration of a portion of a semiconductor device substrate 670 where memory arrays 642, 644 and logic region 646 are formed. In this example, the substrate 670 includes an insulating layer, and conductors 672 are formed over substrate 670. Within memory arrays 642 and 644, the conductors 672 are bit lines that make electrical contact to drain regions of transistors (not shown). Within logic region 646, the conductors are interconnects electrically connected to various components (transistors, capacitors, resistors, etc.).

FIG. 29 shows how the overlying insulating layer 674 has a topography along the upper surface of the insulating layer 674 that varies (no polishing dummy features added). If polishing dummy features are not added and the substrate is polished to planarize the insulating layer 674, the thickness of the insulating layer 674 over the substrate 670 in the memory arrays 642 and 644 will be thicker than the thickness of the insulating layer 674 over the substrate 670 in the logic region 646.

Figure 30:
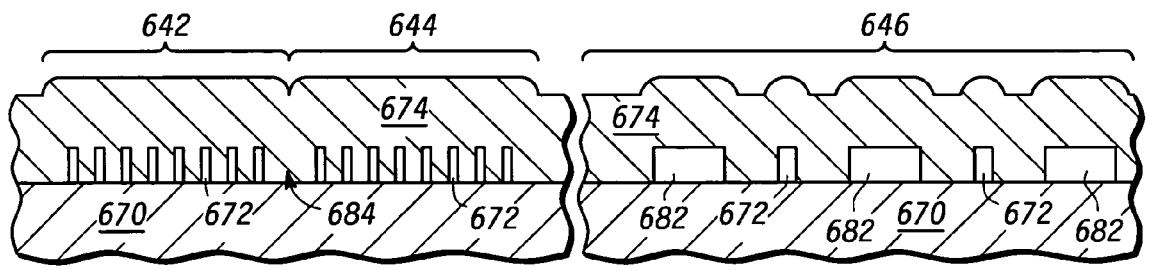

This problem may be overcome by placing polishing dummy features, comprising BNNTs or other nanoparticle compositions, in open locations having widths, for example, in a range of 5-10 microns. One such location lies between memory array 642 and 644. However, in accordance with one particular, non-limiting embodiment of the tiling methodology disclosed herein, polishing dummy features 682 are inserted into the mask, preferably at the same feature level as the conductors 672. The resulting pattern is seen in a semiconductor device in FIG. 30. Note that no polishing dummy features are placed in the gap 684 between the memory arrays 642 and 644. The gap is in a range of approximately 20-100 microns wide. Also, similar gaps (not shown) may lie between memory blocks within either or both memory arrays 642 and 644.

Typically, the polishing dummy features 682 are at least approximately 0.3 mm away from the nearest conductor 672 (active feature) within the area having the highest active feature density, and often will be at least 1 mm away. In this specific embodiment, the polishing dummy features 682 closest to the active features within the area having the highest active feature density lie in a range of approximately 3-5 mm away from each other (polishing dummy feature-to-active feature spacing). The minimum gaps and spacing for polishing dummy features may be determined at least in part from the polishing characterization.

The polishing dummies may be formed using the various deposition and etching techniques described herein for nanoparticle materials. After the conductors 672 and polishing dummy features 682 are formed over the substrate 670, the insulating layer 674 is formed by depositing one or more insulating films over the conductors 672 and polishing dummy features 682. The average elevation of the upper surface of insulating layer 674 for the left-hand portion of FIG. 31 (arrays 642 and 644) is closer to the average elevation of the upper surface of the insulating layer 674 over the logic region 646.

Figure 31:
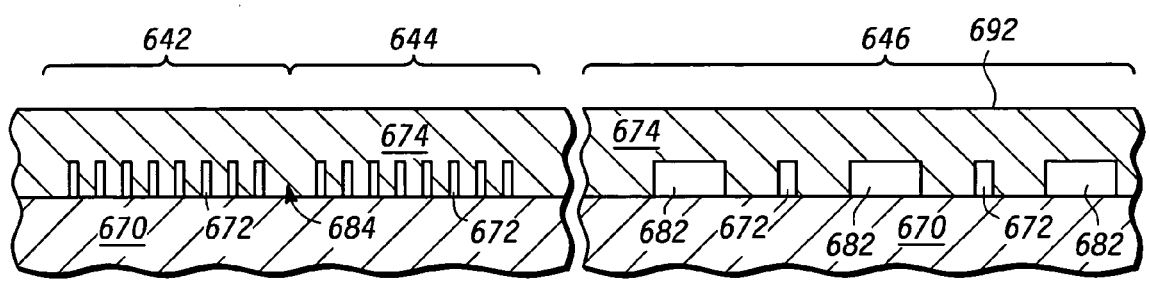

After depositing the layer 674, it is then polished to achieve a substantially planar surface 692 as shown in FIG. 31. The conditions used in polishing, including the polishing pad, polishing fluid, and polishing parameters, affect the polishing characterization, which at least in part determines the polishing dummy feature placement. It is not necessary that a perfectly planar surface be the result of the polishing. The amount of undulation should be such that it does not significantly affect the electronic performance (no electrical shorts or leakage paths) or subsequent processing (depth of focus in lithography or etch-related concerns).

The methodologies disclosed herein may be used in conjunction with various molding and stamping processes to produce a variety of structures that incorporate nanoparticle compositions. One example of such a process is depicted in FIGS. 32-34.

Figure 32:
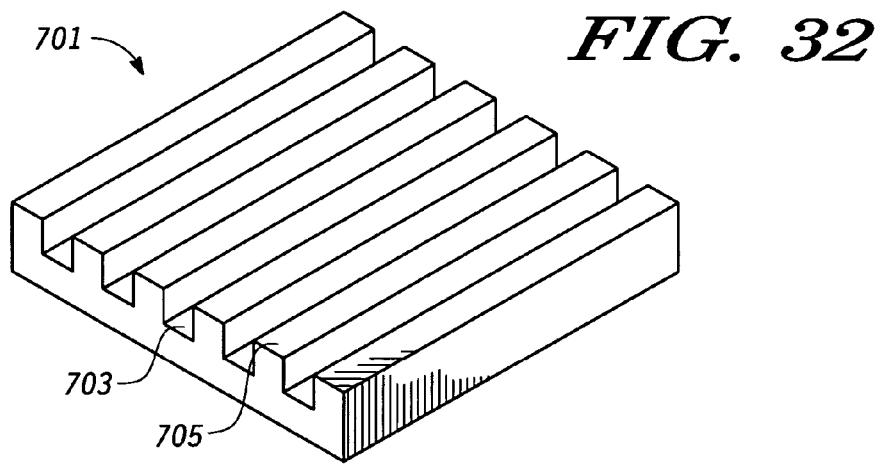
FIGS. 32-34 are illustrations depicting a molding process in accordance with the teachings herein.

With reference to FIG. 32, a mold 701 is provided which has a negative replica of one or more features therein which are to be reproduced on a surface. In the particular embodiment depicted, these features comprise a series of parallel trenches 703 which are separated from one another by intervening ridges 705, though it will be appreciated that a wide variety of features may be produced. Such a mold preferably comprises a material such as silicon, polysilicon, a sacrificial oxide, or the like, though it may also comprise a patterned BNNT film fabricated using the processes described herein. The aforementioned features may be produced through lithography or through other suitable methods as are known to the art.

Figure 33:
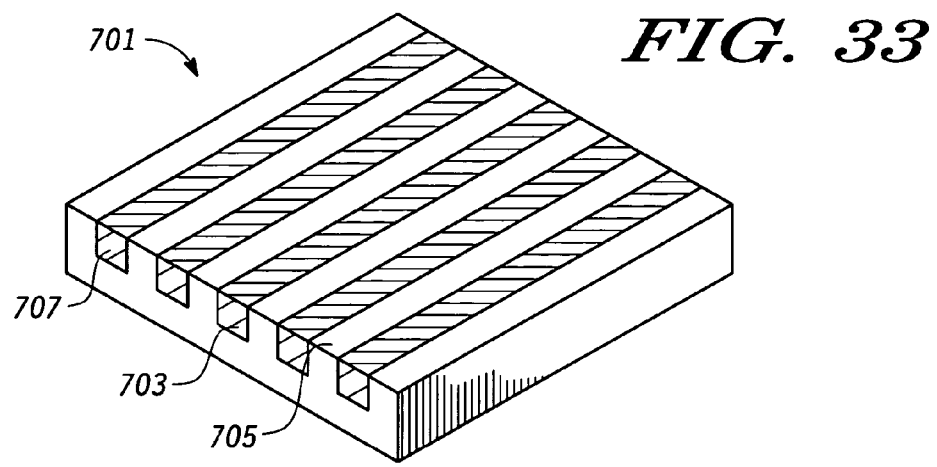

Referring now to FIG. 33, the trenches are backfilled with a nanoparticle composition 707, such as BNNT (in one particular embodiment wherein the mold itself comprises BNNT, the backfill material comprises conductive carbon-based nanoparticles). This is preferably accomplished by depositing the nanoparticles into the trenches from a liquid medium, such as an aqueous suspension. Alternatively, in applications where catalyst contamination is not problematic or can be dealt with, the trenches may be lined with a layer of catalyst, and a layer of nanoparticles may be grown on the layer of catalyst using, for example, the technique illustrated in FIGS. 2-5 herein. Where appropriate, the resulting structure may be subjected to plasma etching (using, for example, a chlorine plasma), chemical mechanical polishing, or the like to produce the structure depicted in which the surface of the backfilled device is substantially planar.

Figure 34:
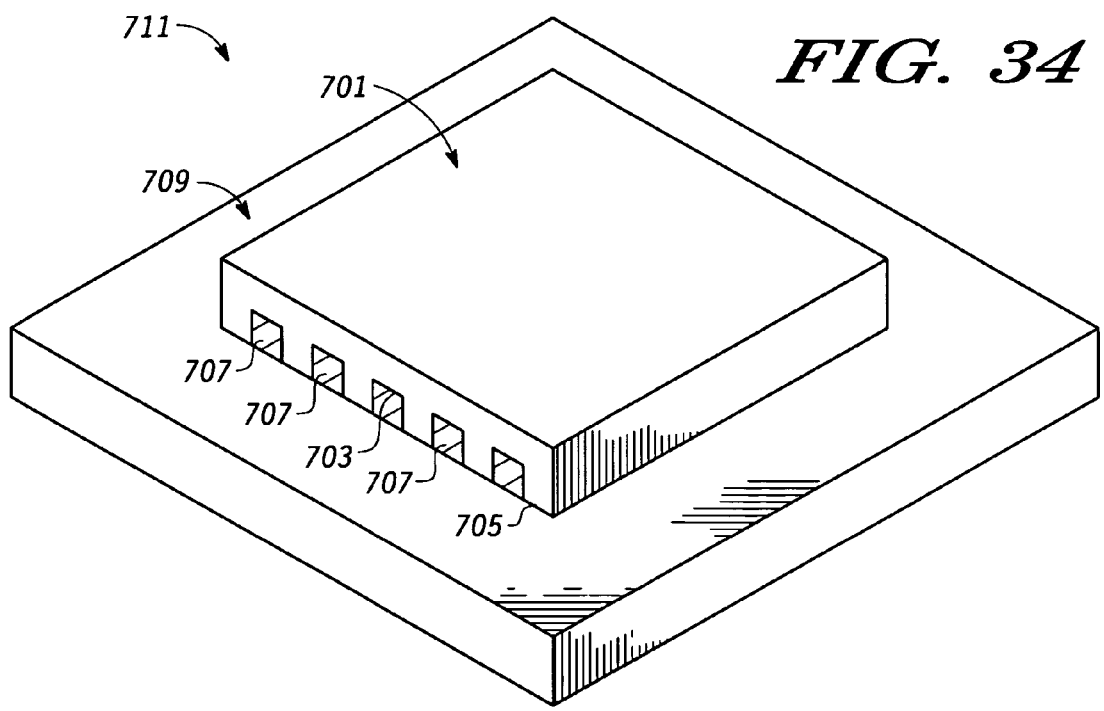

Referring now to FIG. 34, the backfilled mold 701 is disposed on a surface 709, such as a silicon wafer. The resulting device 711 may be subjected to thermal treatment to ensure adequate adhesion between the mold 701 and the substrate 709 or, alternatively, a suitable adhesive may be employed for this purpose. The device 711 may then be subjected to various subsequent processing steps. For example, the device may be subjected to chemical mechanical polishing to remove the mold backing, in which case the nanoparticle composition 707 may serve to control the planarization of the device, as described in reference to FIGS. 29-31.

A number of variations are possible in the methodology depicted in FIGS. 32-34. For example, rather than positioning the mold 701 face down on the substrate 709 such that the nanoparticle composition 707 is in contact with the substrate 709, the mold 701 could also be positioned in a face up orientation on the substrate 709. The resulting structure could then be subjected to a number of subsequent processing steps. For example, the mold may be subjected to epitaxial growth. If the mold comprises a single crystal semiconductor material (such as, for example, single crystal silicon), the backfilled mold may be epitaxially grown in a manner that requires little, if any, planarization. Suitable methodologies for achieving such growth are described, for example, in commonly assigned U.S. Ser. No. 10/328,923 (Gogoi et al.), filed on Dec. 23, 2002. Such a process may be used to achieve a number of interesting structures having one or more embedded portions of the nanoparticle composition.

It will also be appreciated that the structure depicted in FIG. 33 is itself useful in a variety of other processes and devices. For example, the structure shown in FIG. 33 could be further processed to define circuitry on a surface thereof. For example, if the mold comprises BNNTs, then CNNTs (carbon nitride nanotubes) could be deposited on the surface of the mold to define CNNT-based interconnects.

A variety of structures are achievable through processes of the type depicted in FIGS. 32-34. Depending on the particular choice of nanoparticle composition, these structures may have a number of advantageous properties. For example, when BNNTs are selected as the nanoparticle composition, structures can be made having vastly improved Young's moduli. Such structures are particularly beneficial in stress management applications.

Moreover, depending in part on the dimensions of the surface features of the mold, it is possible to produce a variety of structures in which the nanoparticles are oriented within the surface features of the mold. Orientation of the nanoparticles can be useful in producing structures having improved mechanical and/or electrical properties, depending on the choice of nanoparticle composition.

The methodologies described herein may also be applied to the formation of layers or components in various devices and heterostructures. For example, these methods may be used to define one or more layers of a nanoparticle composition in a heterojunction bipolar transistor or other such device, or to create spacers, based on BNNT or other nanoparticle materials, around gate structures.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for forming a dielectric layer, comprising:
   providing a substrate;
   providing a first material comprising a suspension of boron nitride nanoparticles in a liquid medium; and
   forming a dielectric layer on the substrate from the suspension through an evaporative process.

2. The method of claim 1, wherein the dielectric layer is formed in a back end of line (BEOL) process.

3. The method of claim 2, wherein the dielectric layer is disposed adjacent to an interconnect structure.

4. The method of claim 1, wherein the dielectric layer is formed through a spin-on process.

5. The method of claim 1, wherein the suspension is an aqueous suspension.

6. The method of claim 1, wherein said suspension comprises BNNT.

7. The method of claim 1, wherein the evaporative process includes irradiating the substrate with IR radiation.

8. The method of claim 1, wherein the evaporative process is a flash evaporative process.

9. The method of claim 1, wherein the dielectric layer is formed by a non-electrolytic process.

10. The method of claim 1, wherein the suspension is self-depositing.

11. The method of claim 1, wherein the suspension is formed by recrystallizing the nanoparticles.

12. The method of claim 1, wherein the nanoparticles are devoid of functional groups.

13. The method of claim 1, wherein the suspension is a suspension of pure boron nitride nanoparticles disposed in a liquid medium.

14. The method of claim 1, wherein the dielectric layer is patterned to form a MEMS device.

15. The method of claim 1, wherein the dielectric layer is patterned to form a MEMS anchor.

16. The method of claim 1, wherein the dielectric layer is formed through a non-catalytic process.

17. A method for forming a dielectric layer, comprising:
   providing a suspension of boron nitride nanoparticles in a liquid medium; and
   depositing the nanoparticles onto a substrate in a non-electrolytic manner, thereby forming a dielectric layer.

18. The method of claim 17, wherein said particles are chemically inert.

19. The method of claim 17, wherein said particles are devoid of functional chemical groups.

20. The method of claim 17, wherein said suspension is a pure suspension.

21. The method of claim 17, wherein said suspension comprises at least 99% by weight of nanoparticles, based on the total weight of solids in the suspension.

22. A method for forming a dielectric layer, comprising:
   providing a self-depositing suspension of boron nitride nanoparticles in a liquid medium; and
   exposing a substrate to said suspension, thereby forming a layer of the nanoparticles on the substrate.

23. The method of claim 22, wherein said boron nitride nanoparticles are BNNTs.

24. A method for forming a dielectric layer on a substrate, comprising:
   providing a substrate;
   providing a material comprising boron nitride nanoparticles;
   forming a solution or suspension of the boron nitride nanoparticles; and
   recrystallizing the nanoparticles onto the substrate;
   wherein said substrate is patterned with a plurality of parallel longitudinal grooves, and wherein said nanoparticles are recrystallized onto the substrate in such a way that the nanoparticles are oriented along the common longitudinal axis of the grooves.

25. The method of claim 24, wherein the nanoparticles are recrystallized as a dielectric layer.

26. A method for forming dielectric layers in a back end of line (BEOL) process, comprising:

providing a substrate;
providing a composition comprising boron nitride nanoparticles disposed in a liquid medium; and
forming a layer on the substrate from the composition.

27. The method of claim 26, wherein said layer is a dielectric layer.

28. The method of claim 26, wherein said composition comprises a suspension of nanoparticles in a liquid medium.

29. The method of claim 28, wherein said dielectric layer is formed through an evaporative process.

30. The method of claim 26, wherein said composition comprises a solution of nanoparticles in said liquid medium.

31. The method of claim 26, wherein said composition comprises a suspension of nanoparticles in said liquid medium.

32. The method of claim 26, wherein said composition comprises a suspension of BNNTs in said liquid medium.

33. The method of claim 26, wherein the step of forming a dielectric layer on the substrate does not involve electrolytic deposition.

34. The method of claim 26, wherein said nanoparticles are electrolytically inert.

35. The method of claim 26, further comprising:
forming a mask on the layer, said mask having at least one opening defined therein; and
etching the layer through the opening with a chlorine plasma, thereby forming a trench in the layer.

36. The method of claim 35, further comprising the step of treating the exposed surfaces of the trench with an argon plasma.

37. The method of claim 35, further comprising the step of depositing a diffusion barrier layer over the surface of the trench.

38. The method of claim 37, wherein the diffusion barrier comprises boron carbon nitride.

39. A method for forming a patterned dielectric layer in a back end of line (BEOL) process, comprising:
providing a substrate;
forming a dielectric layer on the substrate from a composition comprising boron nitride nanoparticles disposed in a liquid medium;
forming a mask over the dielectric layer, said mask having at least one opening defined therein; and
etching the dielectric layer with a chlorine plasma through the at least one opening.

40. The method of claim 39, wherein the dielectric layer is patterned to form a MEMS device.

41. The method of claim 39, wherein the dielectric layer is patterned to form a MEMS anchor.

42. The method of claim 17, wherein the dielectric layer is formed through a spin-on process.

43. The method of claim 17, wherein the nanoparticles are deposited by an evaporative process which includes irradiating the substrate with IR radiation.

44. The method of claim 17, wherein the nanoparticles are deposited by a flash evaporative process.

45. The method of claim 17, wherein the suspension is self-depositing.

46. The method of claim 17, wherein the suspension is formed by recrystallizing the nanoparticles.

47. The method of claim 17, wherein the nanoparticles are devoid of functional groups.

* * * * *